(12) United States Patent
Noh

(10) Patent No.: US 12,245,370 B2
(45) Date of Patent: Mar. 4, 2025

(54) PRINTED CIRCUIT BOARD

(71) Applicant: SAMSUNG ELECTRO-MECHANICS CO., LTD., Suwon-si (KR)

(72) Inventor: Seung Hyun Noh, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 350 days.

(21) Appl. No.: 17/861,484

(22) Filed: Jul. 11, 2022

(65) Prior Publication Data

US 2023/0199946 A1    Jun. 22, 2023

(30) Foreign Application Priority Data

Dec. 22, 2021    (KR) .................. 10-2021-0185229

(51) Int. Cl.
*H05K 1/18*    (2006.01)
*H05K 1/02*    (2006.01)

(52) U.S. Cl.
CPC ............ *H05K 1/0298* (2013.01); *H05K 1/18* (2013.01)

(58) Field of Classification Search
CPC .............................. H05K 1/0298; H05K 1/18

USPC ........................................................ 361/760
See application file for complete search history.

(56) References Cited

U.S. PATENT DOCUMENTS

| | | | | |
|---|---|---|---|---|
| 6,931,724 B2 * | 8/2005 | Rokugawa | ............. | H05K 1/113 430/314 |
| 7,013,560 B2 * | 3/2006 | Liu | ........................ | H05K 3/421 174/262 |
| 8,027,169 B2 * | 9/2011 | Niki | ........................ | H05K 1/115 174/255 |
| 8,143,531 B2 * | 3/2012 | Miki | ................. | H01L 23/49822 174/262 |

FOREIGN PATENT DOCUMENTS

| | | |
|---|---|---|
| JP | 2016-122776 A | 7/2016 |
| JP | 2017-045923 A | 3/2017 |
| KR | 10-2019-0046214 A | 5/2019 |

* cited by examiner

*Primary Examiner* — Binh B Tran
(74) *Attorney, Agent, or Firm* — Morgan, Lewis & Bockius LLP

(57) ABSTRACT

A printed circuit board includes: an insulating layer; a conductive pattern disposed within the insulating layer; a skin layer disposed on the insulating layer and having an opening on the conductive pattern; and a connection layer at least partially surrounded by the skin layer, disposed in the opening to connect to a portion of the conductive pattern, and containing gold (Au).

20 Claims, 15 Drawing Sheets

'A'

PRINTED CIRCUIT BOARD

CROSS-REFERENCE TO RELATED APPLICATION(S)

This application claims benefit of priority to Korean Patent Application No. 10-2021-0185229 filed on Dec. 22, 2021 in the Korean Intellectual Property Office, the disclosure of which is incorporated herein by reference in its entirety.

TECHNICAL FIELD

The present disclosure relates to a printed circuit board.

BACKGROUND

In accordance with improvements in performance and/or super-integration of electronic devices or electric devices in which printed circuit boards may be used, a size of each component of the printed circuit board has also been gradually decreased. As a size of the printed circuit board itself or each component of the printed circuit board becomes smaller, difficulty in securing reliability of the printed circuit board may increase.

SUMMARY

An aspect of the present disclosure may provide a printed circuit board.

According to an aspect of the present disclosure, a printed circuit board may include: an insulating layer; a conductive pattern disposed within the insulating layer; a skin layer disposed on the insulating layer and having an opening on the conductive pattern; and a connection layer at least partially surrounded by the skin layer, disposed in the opening to connect to a portion of the conductive pattern, and containing gold (Au).

According to another aspect of the present disclosure, a printed circuit board may include: a first insulating layer; a first conductive pattern disposed within the first insulating layer; a first skin layer disposed on the first insulating layer and having a first opening on the first conductive pattern; a connection layer at least partially surrounded by the first skin layer and disposed in the first opening to connect to a portion of the first conductive pattern; a second insulating layer surrounding an area overlapping the first insulating layer in a vertical direction; a second conductive pattern disposed within the second insulating layer; and a second skin layer disposed on the second insulating layer and having a second opening on the second conductive pattern. An insulating material contained in the first skin layer is different from an insulating material contained in the second skin layer.

According to another aspect of the present disclosure, a printed circuit board may include: an insulating layer; a conductive pattern disposed within the insulating layer; a skin layer disposed on the insulating layer and having an opening on the conductive pattern; and a connection layer disposed in the opening to connect to a portion of the conductive pattern. An interface between the conductive pattern and the connection layer is disposed on a level of an interface of the insulating layer and the skin layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1A:
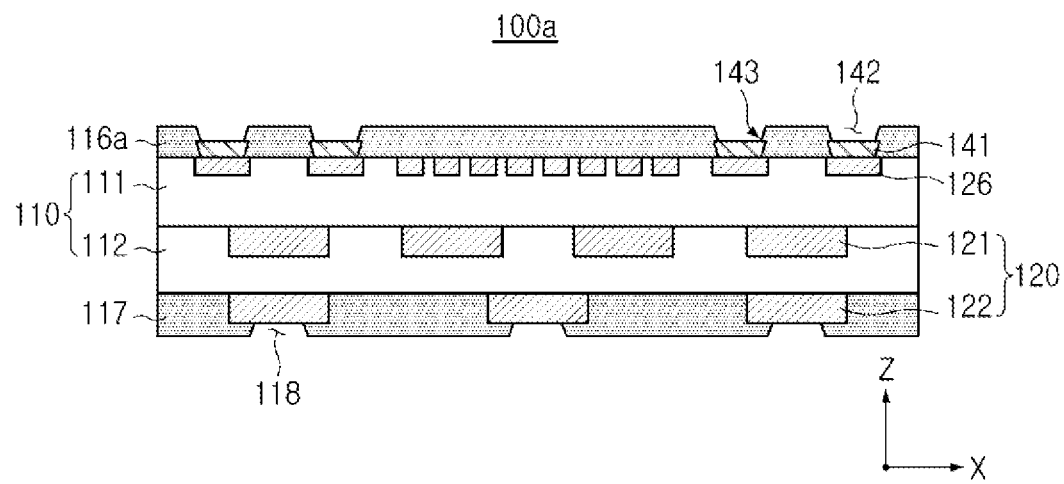
FIGS. 1A through 1D are side views illustrating printed circuit boards according to an exemplary embodiment in the present disclosure.

Hereinafter, exemplary embodiments of the present disclosure will now be described in detail with reference to the accompanying drawings.

FIGS. 1A through 1D are side views illustrating printed circuit boards according to an exemplary embodiment in the present disclosure.

Referring to FIGS. 1A through 1D, a printed circuit board 100a, 100b, 100c, or 100d according to an exemplary embodiment in the present disclosure may include an insulating layer 110, a conductive pattern 126, and a skin layer 116a, 116b, or 116c, and a connection layer 141.

The insulating layer 110 may contain an insulating material. For example, the insulating layer 110 may contain an insulating material different from an insulating material of the skin layer 116a, 116b, or 116c. Such an insulating material may be prepreg, Ajinomoto build-up film (ABF), FR-4, Bismaleimide Triazine (BT), a photoimagable dielectric (PID) resin, or a general copper clad laminate (CCL) or may be at least one selected from the group consisting of a thermosetting resin such as epoxy resin, a thermoplastic resin such as polyimide, polytetrafluoroethylene (PTFE), and glass-based and ceramic-based (e.g., low temperature co-fired ceramic (LTCC)) resins.

The insulating layer 110 may be at least one of a plurality of insulating layers 111 and 112. As the number (e.g., two or three) of layers of the plurality of insulating layers 111 and 112 decreases, it may be advantageous in allowing the printed circuit board 100a, 100b, 100c, or 100d to have a coreless structure that does not include a core layer, a thickness of each of the plurality of insulating layers 111 and 112 may also be decreased, an entire thickness of the printed circuit board 100a, 100b, 100c, or 100d may also be decreased, and a possibility that the printed circuit board 100a, 100b, 100c, or 100d will be warped may also be decreased.

The conductive pattern 126 may be disposed within the insulating layer 110. As a thickness of the insulating layer 110 decreases, a thickness and/or a width of the conductive pattern 126 may also decrease. For example, the conductive pattern 126 may contain a conductive material (e.g., copper (Cu), silver (Ag), palladium (Pd), aluminum (Al), nickel (Ni), titanium (Ti), gold (Au), or platinum (Pt)), and may be implemented by a semi-additive process (SAP), a modified semi-additive process (MSAP), a subtractive method, or the like. For example, the conductive pattern 126 may be formed by the subtractive method or the like so as not to be surrounded by the skin layer 116a, 116b, or 116c, and may be embedded in the insulating layer 110.

The skin layer 116a, 116b, or 116c may be disposed on the insulating layer 110 so that the conductive pattern 126 is exposed upward of the skin layer 116a, 116b, or 116c. For example, the skin layer 116a, 116b, or 116c may contain an insulating material closer to photosensitivity than the insulating material of the insulating layer 110. Here, "close to photosensitivity" may be defined as a significant change in a curing degree of the insulating material according to a unit time when the insulating material is exposed to light and/or heat. Depending on a design, an encapsulant may be filled on an outer surface of the skin layer 116a, 116b, or 116c, and thus, the skin layer 116a, 116b, or 116c is not to be construed as being limited to being exposed to air.

Since the conductive pattern 126 is exposed upward of the skin layer 116a, 116b, or 116c, the conductive pattern 126 may be electrically connected upward of the skin layer 116a, 116b, or 116c. Due to characteristics of the skin layer 116a, 116b, or 116c, an electrical connection target of the conductive pattern 126 may be a component or an additional substrate electrically connected to the printed circuit board 100a, 100b, 100c, or 100d in a state of being manufactured independently of the printed circuit board 100a, 100b, 100c, or 100d. The component or the additional substrate may be mounted on an upper surface of the printed circuit board 100a, 100b, 100c, or 100d. Holes 142 of the skin layer 116a, 116b, or 116c may be passages through which the component (or the additional substrate) and the conductive pattern 126 are electrically connected to each other.

For example, when the component or the additional substrate is electrically connected to the printed circuit board 100a, 100b, 100c, or 100d, a solder having a low-melting-point metal material (e.g., a Pb-based or Sn-based material) having a melting point lower than a melting point of a metal material (e.g., copper) of the conductive pattern 126 may be used. In this case, the solder may stick the conductive pattern 126 and the component (or the additional substrate) to each other according to a decrease in temperature after the solder is connected to the conductive pattern 126 and the component or the additional substrate at a temperature higher than the low melting point. In this case, the low-melting-point metal material may absorb a portion of the metal material (e.g., copper) of the conductive pattern 126, and may affect reliability of the conductive pattern 126. As a thickness and/or a width of the conductive pattern 126 decreases, a portion of the conductive pattern 126 may be absorbed by the low-melting-point metal material, which significantly affects the reliability of the conductive pattern 126.

At least a portion of the connection layer 141 may be surrounded by the skin layer 116a, 116b, or 116c, and the connection layer 141 may be connected to a portion (e.g., an upper surface of the connection layer 141 overlapping the holes 142) of the conductive pattern 126 exposed through the skin layer 116a, 116b, or 116c. In one example, an interface between the conductive pattern 126 and the connection layer 141 may be disposed on a level of an interface of the insulating layer 111 and the skin layer 116a, 116b, or 116c.

The connection layer 141 may be connected between the conductive pattern 126 and the solder, and may thus prevent a portion of the conductive pattern 126 from being absorbed by the solder.

The connection layer 141 may contain gold (Au). Since gold (Au) may have high conductivity and also have high malleability and high ductility, even though the holes 142 of the skin layer 116a, 116b, or 116c are small, the holes 142 may be more densely filled with gold (Au). The size of the hole 142 may decrease as the thickness and/or the width of the conductive pattern 126 decreases.

Accordingly, the connection layer 141 containing gold (Au) may effectively block the conductive pattern 126 from being absorbed upward of the connection layer 141 and may improve both of miniaturization efficiency and reliability of the conductive pattern 126, even though the size of the hole 142 is small or the thickness and/or the width of the conductive pattern 126 is small.

For example, the connection layer 141 may be formed through electroless plating, and thus, may be an electroless plating layer.

Alternatively, the skin layer 116a, 116b, or 116c may include ABF. The ABF may be effective in improving reliability of the hole 142 when the hole 142 is formed in a small size. For example, since the ABF may have an efficient property in forming the hole 142 through laser processing, the ABF may improve both of miniaturization efficiency and reliability of the hole 142, and may also improve the miniaturization efficiency and the reliability of the conductive pattern 126.

Figure 1B:
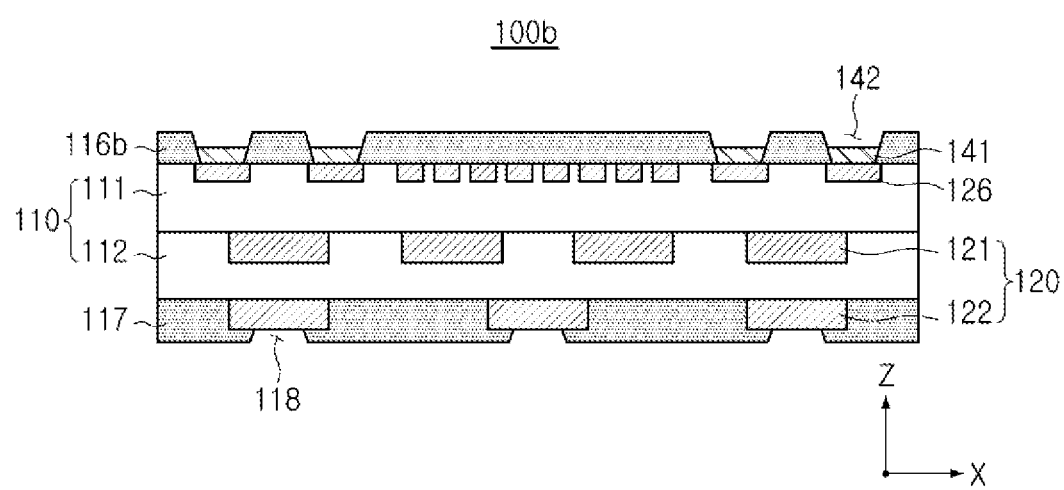
Figure 1C:
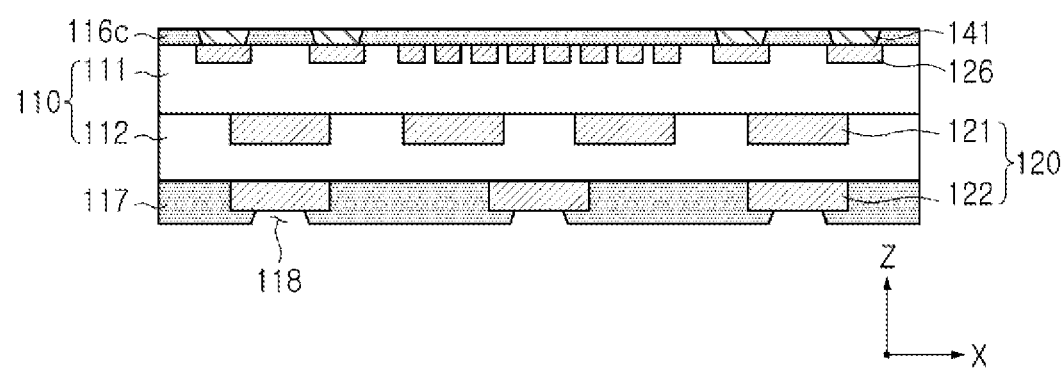
Figure 1D:
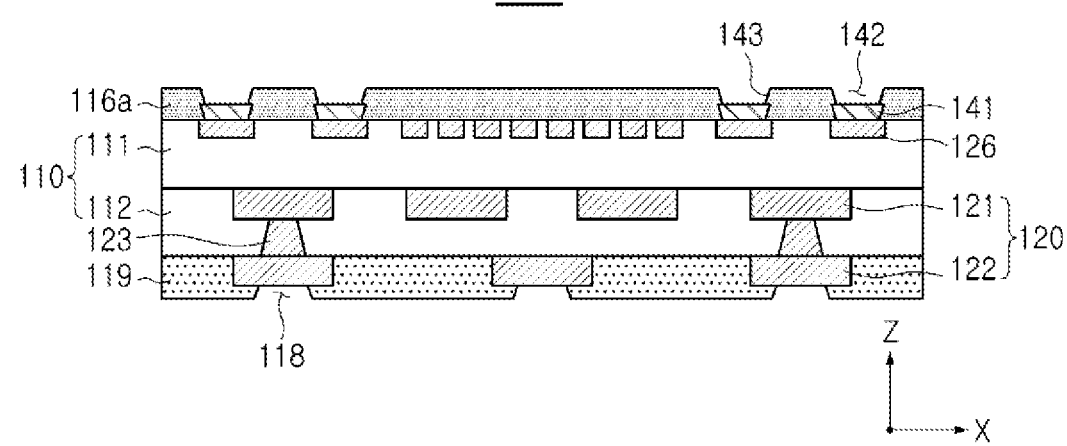

Referring to FIGS. 1A and 1D, a side surface 143 of the skin layer 116a in contact with the connection layer 141 may have a step form. The step form may allow the connection layer 141 to more effectively block a space between upper and lower sides of the connection layer 141, and may also improve stability of a disposition relationship between the skin layer 116a and the connection layer 141. For example, a lower portion of the skin layer 116a may be formed before the connection layer 141 is formed, and an upper portion of the skin layer 116a may be formed after the connection layer 141 is formed, such that the step form may be implemented. That is, a portion of an upper surface of the connection layer 141 may be covered by the later formed upper portion of the skin layer 116a.

Referring to FIGS. 1B and 1C, the skin layer 116b or 116c may not have a step form. For example, the entire skin layer 116b or 116c may be formed before the connection layer 141 is formed. The connection layer 141 may be filled in only a portion of the hole 142 of the skin layer 116b or may be filled in the entire hole 142 of the skin layer 116c. A thickness of the skin layer 116b or 116c may also vary depending on a design.

Referring to FIGS. 1A through 1D, the printed circuit board 100a, 100b, 100c, or 100d according to an exemplary embodiment in the present disclosure may further include at least one of lower conductive patterns 121 and 122, interlayer vias 123, and a lower skin layer 117 or 119.

The lower conductive patterns 121 and 122 may be disposed at a different height from the conductive pattern 126, and may be formed in the same manner as the conductive pattern 126. For example, a thickness and/or a width of each of the lower conductive patterns 121 and 122 may be greater than the thickness and/or the width of the conductive pattern 126.

For example, the interlayer via 123 may vertically connect the lower conductive patterns 121 and 122 to each other, and may be formed by filling a hole formed by a laser beam or a drill with a conductive material (e.g., copper (Cu), silver (Ag), palladium (Pd), aluminum (Al), nickel (Ni), titanium (Ti), gold (Au), or platinum (Pt)). Depending on a design, the interlayer via 123 may also be vertically connected to the conductive pattern 126. In this case, the conductive pattern 126 may be electrically connected to a component or an additional substrate disposed below the printed circuit board 100*a*, 100*b*, 100*c*, or 100*d*.

The lower skin layer 117 or 119 may have lower holes 118 so that portions of the lower conductive patterns 121 and 122 are exposed downward, and may contain an insulating material closer to photosensitivity than the insulating material of the insulating layer 110. Referring to FIGS. 1A through 1C, the lower skin layer 117 may contain the same insulating material (e.g., ABF) as the insulating material of the skin layer 116*a*, 116*b*, or 116*c*. Referring to FIG. 1D, the lower skin layer 119 may contain an insulating material (e.g., a solder resist) different from the insulating material of the skin layer 116*a*.

Figure 2A:
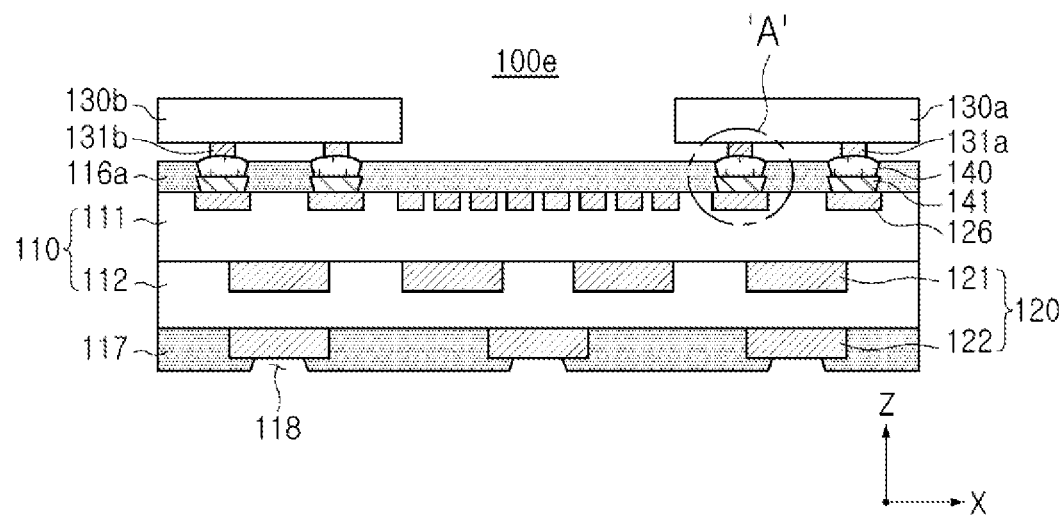
FIG. 2A is a side view illustrating a structure in which a first integrated circuit (IC) and a second IC are connected to the printed circuit board according to an exemplary embodiment in the present disclosure.

FIG. 2A is a side view illustrating a structure in which a first integrated circuit (IC) and a second IC are connected to the printed circuit board according to an exemplary embodiment in the present disclosure.

Referring to FIG. 2A, a printed circuit board 100*e* according to an exemplary embodiment in the present disclosure may further include at least one of solders 140, a first IC 130*a*, and a second IC 130*b*.

The solder 140 may be in contact with the connection layer 141 and have a melting point lower than the melting point of the conductive pattern 126. The connection layer 141 may block the solder 140 from absorbing a portion of the conductive pattern 126.

The first IC 130*a* and/or the second IC 130*b* may be electrically connected to the connection layer 141 through the solders 140, above the skin layer 116*a*. The first IC 130*a* and the second IC 130*b* may be connected to the solders 140 through connection ends 131*a* and 131*b*, respectively. The connection ends 131*a* and 131*b* may be pins or pads.

For example, each of the first IC 130*a* and the second IC 130*b* may include a memory chip such as a volatile memory (e.g., a dynamic random access memory (DRAM)), a nonvolatile memory (e.g., a read only memory (ROM)), or a flash memory; an application processor chip such as a central processor (e.g., a central processing unit (CPU)), a graphics processor (e.g., a graphic processing unit (GPU)), a digital signal processor, a cryptographic processor, a microprocessor, or a microcontroller; and a logic chip such as a communication model, an analog-digital converter, or an application-specific IC (ASIC), but is not limited thereto.

The first IC 130*a* and the second IC 130*b* may be integrated into a single IC, while the first IC 130*a* and the second IC 130*b* may perform two groups of operations divided from operations of the single IC, respectively, and thus, a required standard for performing operations of each of the first IC 130*a* and the second IC 130*b* may be lowered. That is, implementation efficiency of the first IC 130*a* and the second IC 130*b* itself may be improved.

For example, the first IC 130*a* may be electrically connected to a portion of the connection layer 141, and the second IC 130*b* may be electrically connected to another portion of the connection layer 141. Here, a portion and another portion of the connection layer 141 may be physically separated from each other and may be electrically connected through the conductive pattern 126. Accordingly, an electrical length between the first IC 130*a* and the second IC 130*b* may be decreased, and operation interworking efficiency (e.g., synchronization efficiency, sequence efficiency, and energy efficiency) between the first IC 130*a* and the second IC 130*b* may be increased.

That is, in the printed circuit board 100*e* according to an exemplary embodiment in the present disclosure, the implementation efficiency of the first IC 130*a* and the second IC 130*b* itself may be improved, and the operation interworking efficiency between the first IC 130*a* and the second IC 130*b* may also be increased.

Figure 2B:
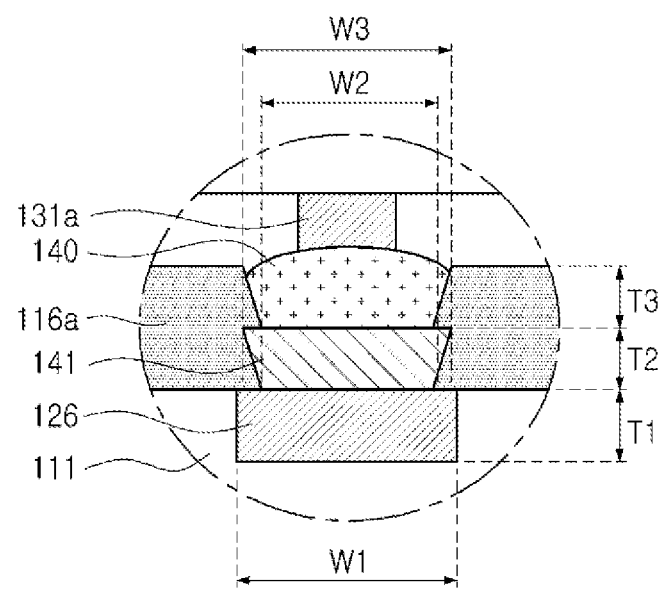
FIG. 2B is an enlarged view of a connection layer and the surrounding of the connection layer of the printed circuit board according to an exemplary embodiment in the present disclosure.

FIG. 2B is an enlarged view of a connection layer and the surrounding of the connection layer of the printed circuit board according to an exemplary embodiment in the present disclosure.

Referring to FIG. 2B, a thickness T1 and/or a width W1 of the conductive pattern 126 may be small to be effective in electrically connecting the first IC 130*a* and the second IC 130*b* to each other so as to be close to each other. For example, the thickness T1 of the conductive pattern 126 may be 10 μm or less, and the width W1 of the conductive pattern 126 may also be small so that a ratio between the thickness T1 and the width W1 becomes close to a reference ratio. Meanwhile, each of thicknesses T1, T2, and T3 and widths W1, W2, and W3 may be measured as an average thickness or an average width.

For example, the width W1 of the conductive pattern 126 may be greater than a minimum width W2 and a maximum width W3 of the connection layer 141. That is, the hole of the skin layer 116*a* may be smaller, and the connection layer 141 may densely block a space between the solder 140 and the conductive pattern 126 even though the hole of the skin layer 116*a* is small.

For example, a thickness T2 of the connection layer 141 may be smaller than a thickness (T2+T3) of the skin layer 116*a* and may be greater than a half of the thickness T1 of the conductive pattern 126. Accordingly, a combination structure between the connection layer 141, the skin layer 116*a*, and the conductive pattern 126 may be generally stable.

FIGS. 3A through 3E are side views illustrating a method of manufacturing a first structure of the printed circuit board according to an exemplary embodiment in the present disclosure, and FIGS. 4A through 4G are side views illustrating a method of manufacturing a second structure of the printed circuit board according to an exemplary embodiment in the present disclosure.

Referring to FIGS. 3A through 3E, a printed circuit board according to an exemplary embodiment in the present disclosure may be manufactured as the printed circuit board illustrated in FIG. 1B after first, second, third, fourth, and fifth steps 100-1*a*, 100-2*a*, 100-3*a*, 100-4*a*, and 100-5*a* are sequentially performed. At least some of the first, second, third, fourth and fifth steps 100-1*a*, 100-2*a*, 100-3*a*, 100-4*a*, and 100-5*a* may be omitted or modified, and thus, the printed circuit board illustrated in FIG. 1B is not limited to being manufactured by the method of manufacturing a printed circuit board illustrated in FIGS. 3A through 3E.

Referring to FIGS. 4A through 4G, a printed circuit board according to an exemplary embodiment in the present disclosure may be manufactured as the printed circuit board illustrated in FIG. 1A after first, second, third, fourth, fifth, sixth, and seventh steps 100-1b, 100-2b, 100-3b, 100-4b, 100-5b, 100-6b, and 100-7b are sequentially performed. At least some of the first, second, third, fourth, fifth, sixth, and seventh steps 100-1b, 100-2b, 100-3b, 100-4b, 100-5b, 100-6b, and 100-7b may be omitted or modified, and thus, the printed circuit board illustrated in FIG. 1A is not limited to being manufactured by the method of manufacturing a printed circuit board illustrated in FIGS. 4A through 4G.

Figure 3A:
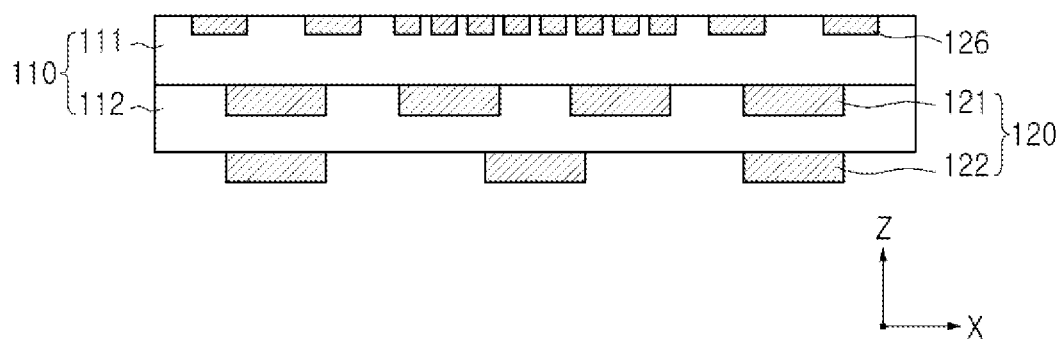
FIGS. 3A through 3E are side views illustrating a method of manufacturing a first structure of the printed circuit board according to an exemplary embodiment in the present disclosure.
Figure 4A:
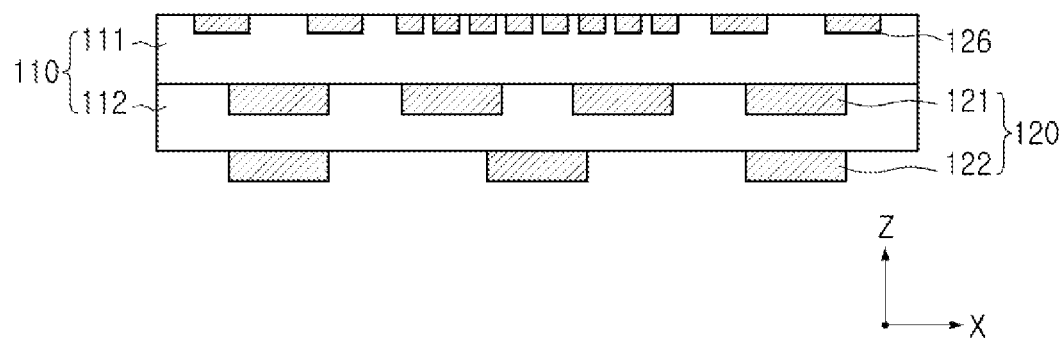
FIGS. 4A through 4G are side views illustrating a method of manufacturing a second structure of the printed circuit board according to an exemplary embodiment in the present disclosure.

Referring to FIGS. 3A and 4A, the insulating layer 110, the lower conductive pattern 120, and the conductive pattern 126 may be formed. For example, the insulating layer 110 may have a structure that does not include a core layer (an insulating layer having a greater thickness or a higher rigidity), and the lower conductive pattern 120 and the conductive pattern 126 may be formed by a photolithography method.

Figure 3B:
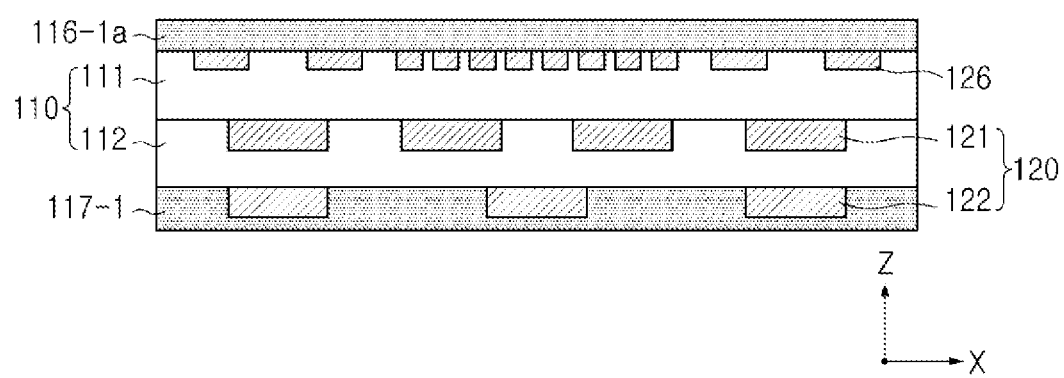
Figure 4B:
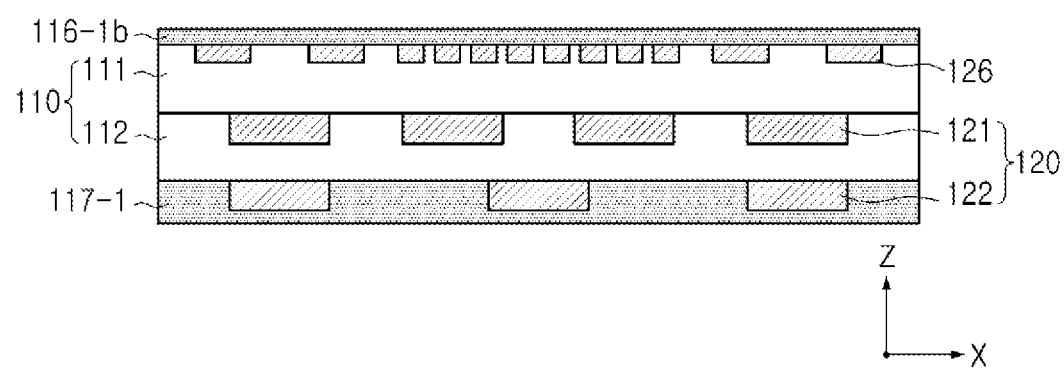

Referring to FIGS. 3B and 4B, a skin layers 116-1a or 116-1b and a lower skin layer 117-1 may be formed on upper and lower surfaces of the insulating layer 110, respectively.

Figure 3C:
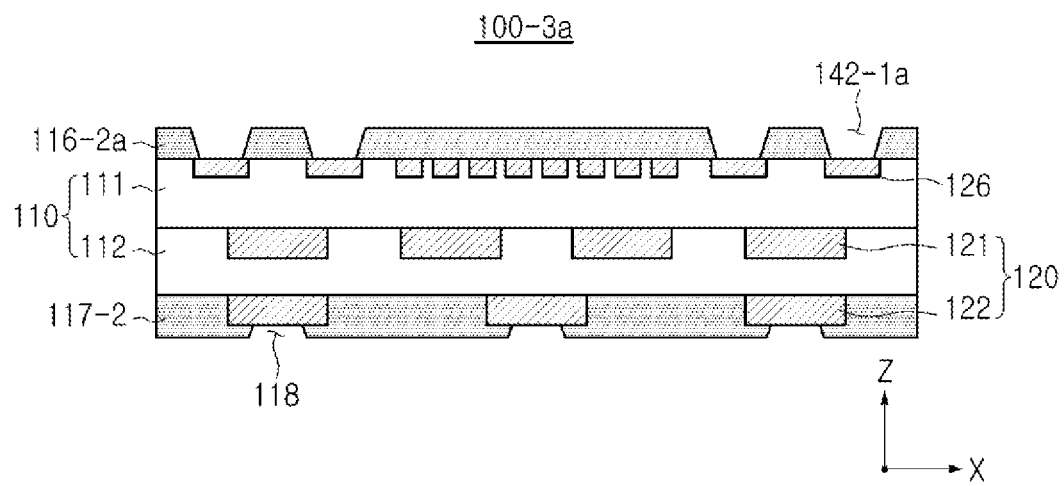
Figure 4C:
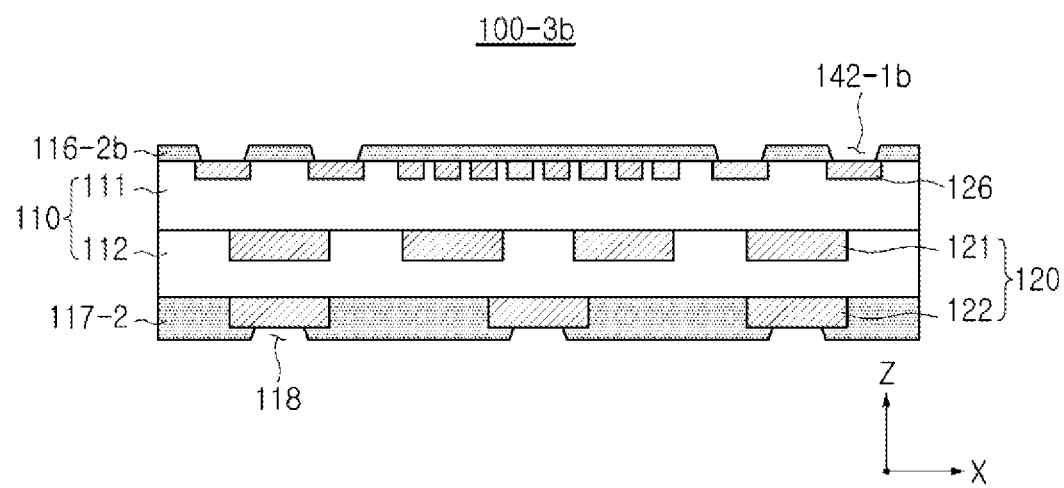

Referring to FIGS. 3C and 4C, a skin layer 116-2a or 116-2b and a lower skin layer 117-2 may be subjected to laser-machining or drilling so as to have holes 142-1a or 142-1b and 118, respectively.

Figure 3D:
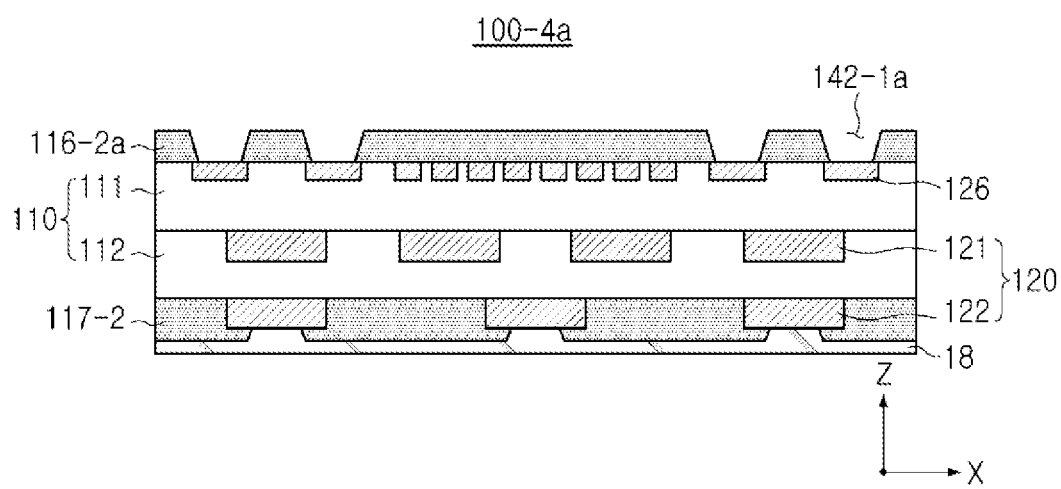
Figure 4D:
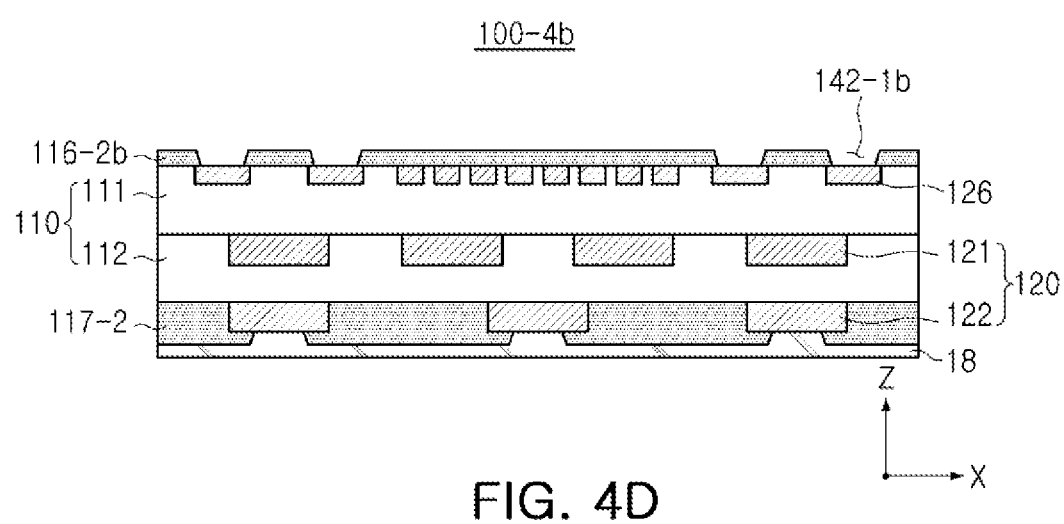

Referring to FIGS. 3D and 4D, a protective layer 18 may be disposed on a lower surface of the lower skin layer 117-2. For example, the protective layer 18 may be a photosensitive film, and may have a structure for preventing a connection layer from being formed on the lower skin layer 117-2 in an electroless plating process.

Figure 3E:
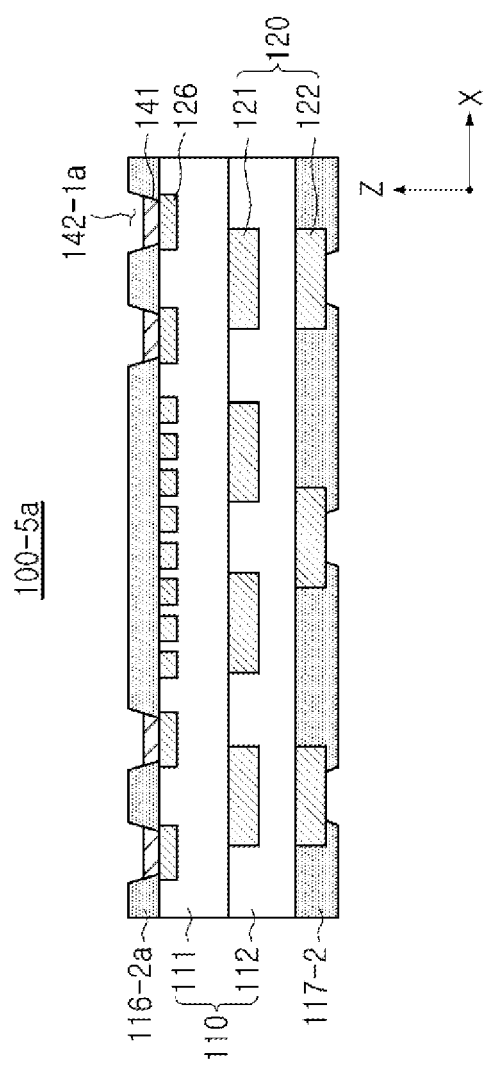
Figure 4E:
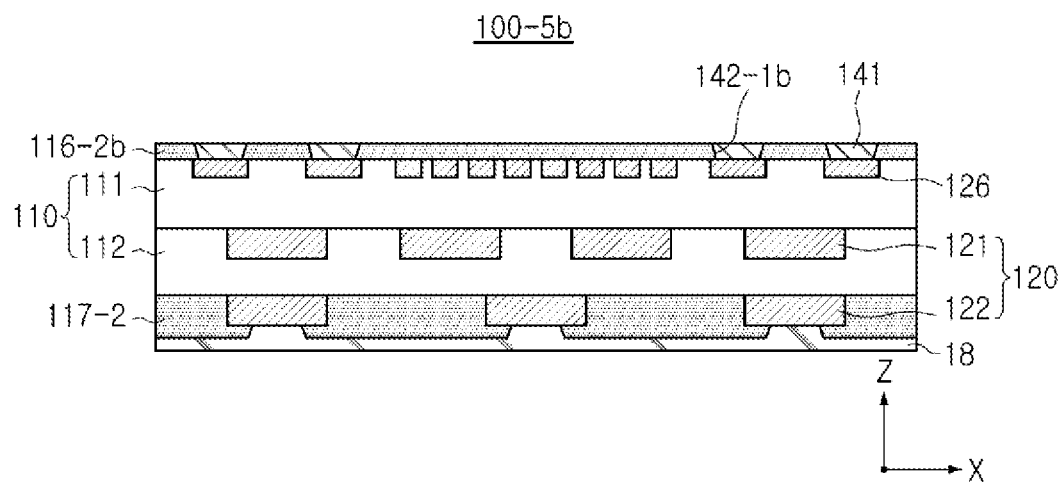

Referring to FIGS. 3E and 4E, the connection layer 141 may be formed in at least portions of holes 142-1a and 142-1b. For example, the connection layer 141 may be formed through electroless gold plating.

Figure 4F:
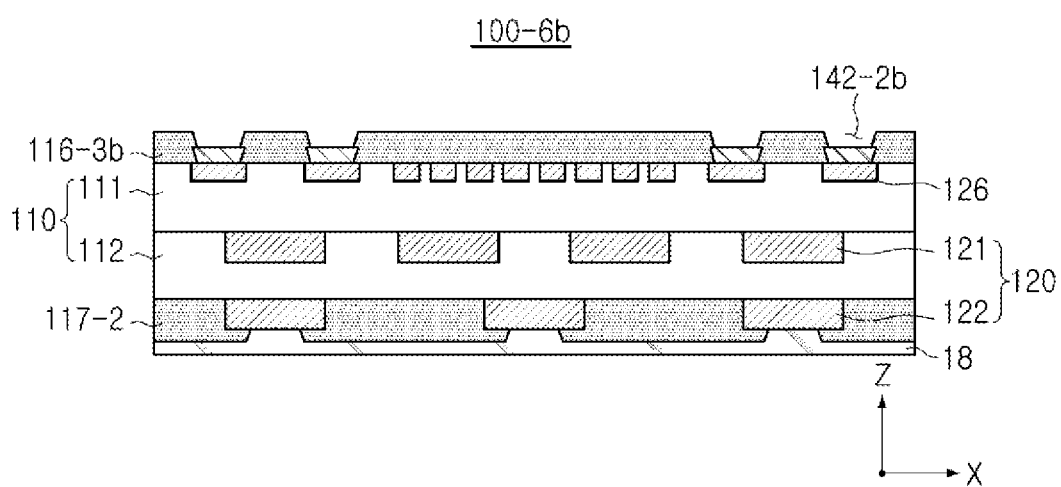

Referring to FIG. 4F, a skin layer 116-3b may become thicker as an upper portion of the skin layer 116-3b is further formed, and portions of the upper portion of the skin layer 116-3b may be drilled through laser machining or drilling so that the connection layer 141 is exposed upward and the hole 142-2b is also formed in the upper portion of the skin layer 116-3b.

Figure 4G:
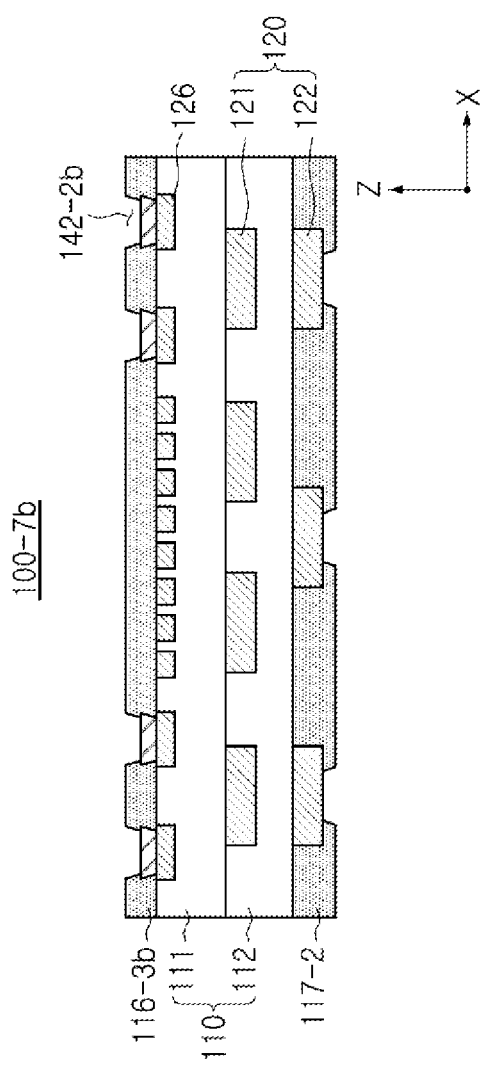

Referring to FIGS. 3E and 4G, the protective layer of the lower skin layer 117-2 may be removed. When the protective layer is the photosensitive film, the protective layer may be removed by light and/or heat.

Figure 5A:
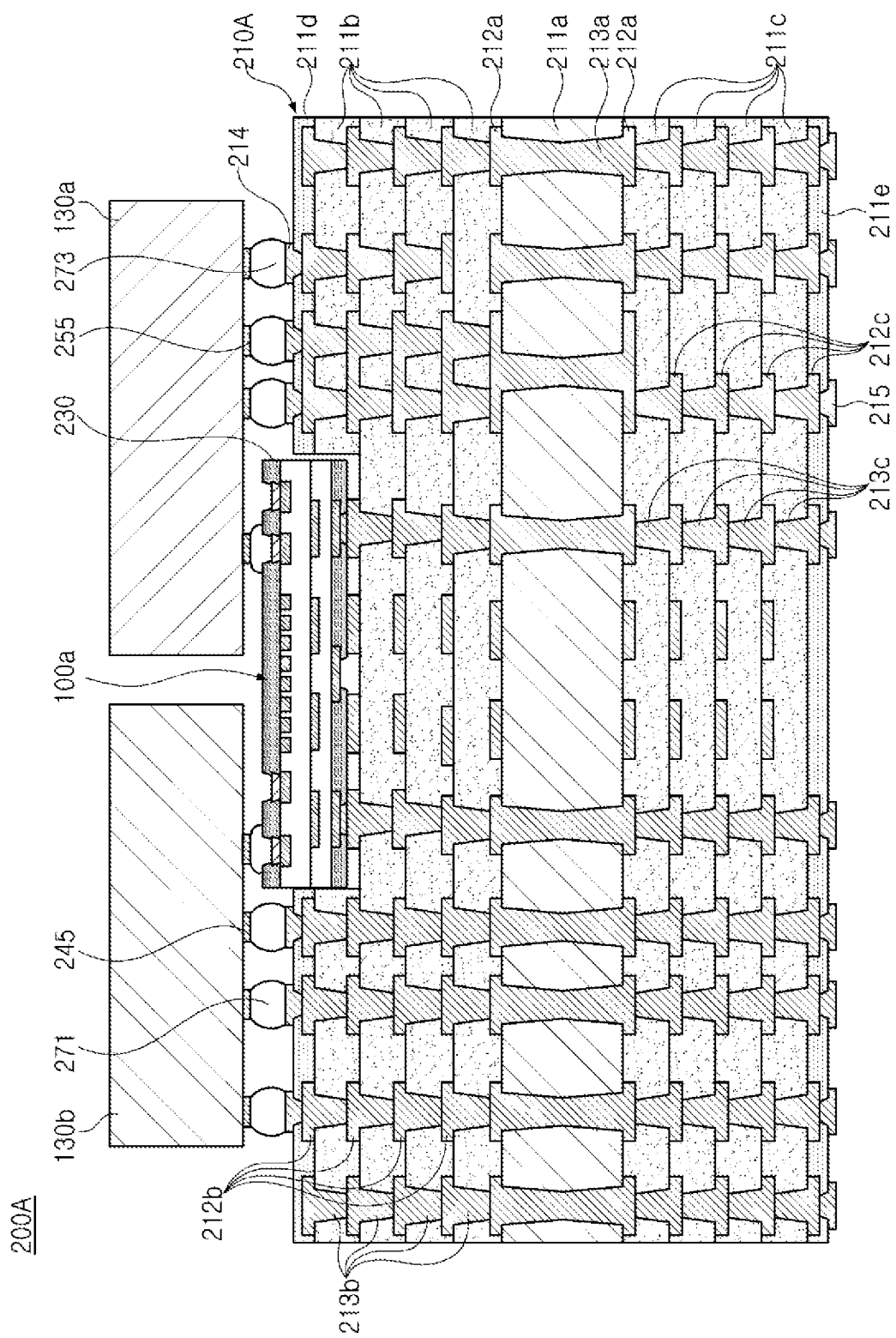
FIG. 5A is a side view illustrating a second insulating layer and a second conductive pattern of a printed circuit board according to another exemplary embodiment in the present disclosure.
Figure 5B:
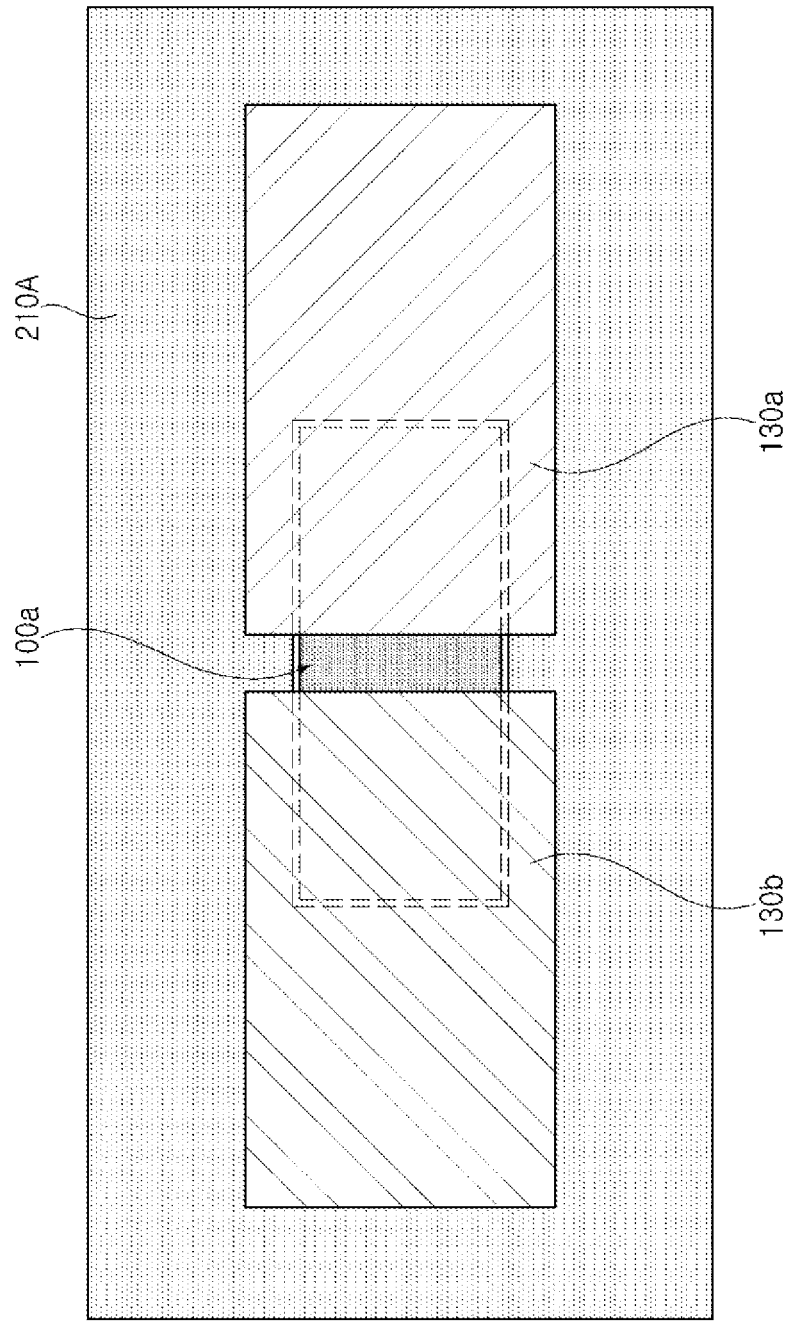
FIG. 5B is a plan view illustrating the printed circuit board of FIG. 5A.

FIG. 5A is a side view illustrating a second insulating layer and a second conductive pattern of a printed circuit board according to another exemplary embodiment in the present disclosure, and FIG. 5B is a plan view illustrating the printed circuit board of FIG. 5A.

Referring to 5A and 5B, a printed circuit board 200A according to another exemplary embodiment in the present disclosure may include the printed circuit board 100a of FIG. 1A, second insulating layers 211b, second conductive patterns 212b, and a second skin layer 211d. Here, the insulating layer, the conductive pattern, and the skin layer of the printed circuit board 100a of FIG. 1A may be a first insulating layer, a first conductive pattern, and a first skin layer, respectively.

The second insulating layers 211b, the second conductive patterns 212b, and the second skin layer 211d may be included in an additional substrate 210A. The printed circuit board 200A according to another exemplary embodiment in the present disclosure may further include the additional substrate 210A. In terms of the additional substrate 210A, the printed circuit board 100a of FIG. 1A may be a bridge board connecting the first and second ICs 130a and 130b to each other. Accordingly, the second insulating layer 211b of the additional substrate 210A may surround an area (including a space occupied by the first insulating layer) overlapping the first insulating layer of the printed circuit board 100a in a vertical direction.

The second conductive pattern 212b may be disposed on the second insulating layer 211b, and the second skin layer 211d may be disposed on the second insulating layer 211b so that the second conductive pattern 212b is exposed.

Since the additional substrate 210A may be relatively greater than the printed circuit board 100a, the second insulating layer 211b and the second conductive pattern 212b may also be relatively greater than the first insulating layer and the first conductive pattern, respectively. Therefore, the importance of the second skin layer 211d preventing the second conductive pattern 212b from being absorbed upward of the second conductive pattern 212b may be relatively lower than the importance of preventing the first conductive pattern from being absorbed upward of the first skin layer.

Accordingly, the insulating material (e.g., ABF) contained in the first skin layer of the printed circuit board 100a may be different from an insulating material (e.g., a solder resist) contained in the second skin layer 211d. For example, the first skin layer may contain an insulating material such as ABF, which is advantageous in improving the miniaturization efficiency and the reliability of the hole, and the second skin layer 211d may contain an insulating material advantageous for a structure in which a size of the additional substrate 210A increases or the number of layers stacked in the additional substrate 210A increases.

Referring to FIGS. 5A and 5B, in the printed circuit board 200A according to another exemplary embodiment in the present disclosure, the first IC 130a may be disposed on a portion of the first skin layer and a portion of the second skin layer 211d of the printed circuit board 100a, and the second IC 130b may be disposed on another portion of the first skin layer and another portion of the second skin layer 211d. Accordingly, the first and second ICs 130a and 130b may be electrically connected to each other so as to be close to each other.

Meanwhile, the additional substrate 210A may further include second interlayer vias 213b and 213c, second lower conductive patterns 212c and 215, second lower insulating layers 211c, and a second lower skin layer 211e, which may be implemented in a similar manner to the interlayer vias, the lower conductive patterns, the insulating layer, and the lower skin layer of the printed circuit board 100a.

For example, the additional substrate 210A may include a core layer 211a having a higher rigidity or a greater thickness than the second insulating layer 211b, and the core layer 211a may provide an advantageous structure for the additional substrate 210A to have a relatively greater size or a larger number of layers than the printed circuit board 100a. For example, the rigidity of the core layer 211a may be adjusted by adjusting a composition of inorganic fillers that may be added to an insulating material contained in the core layer 211a. Core conductive patterns 212a may be disposed on an upper surface and/or a lower surface of the core layer 211a, and core vias 213a may penetrate through the core layer 211a and may be vertically connected to the core conductive patterns 212a.

Figure 6A:
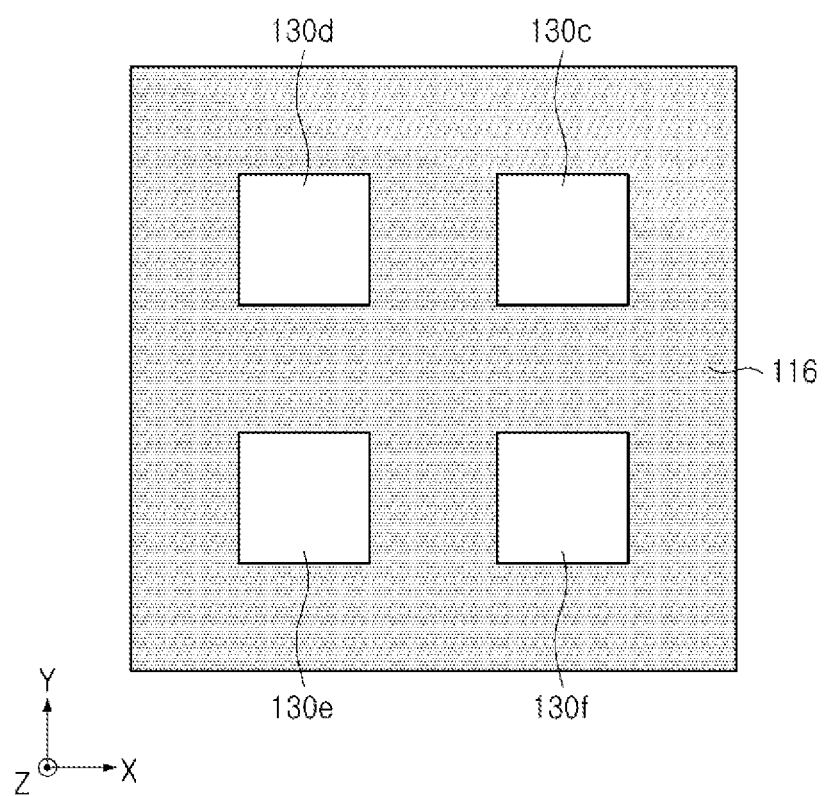
FIG. 6A is a plan view illustrating a structure in which an IC is further added to the printed circuit board of FIG. 2A.

FIG. 6A is a plan view illustrating a structure in which an IC is further added to the printed circuit board of FIG. 2A.

Referring to FIG. 6A, first, second, third, and fourth components 130c, 130d, 130e, and 130f may be disposed on a skin layer 116, and may include ICs or passive components (e.g., capacitors, inductors, resistors, or resonators).

Although in FIGS. 5A and 5B, the printed circuit board 100a of FIG. 1A is included as an example, the present disclosure is not limited thereto. For example, the printed circuit board 100a in FIGS. 5A and 5B may be replaced with the printed circuit board 100b, 100c, or 100d to implement the printed circuit board 200A.

Figure 6B:
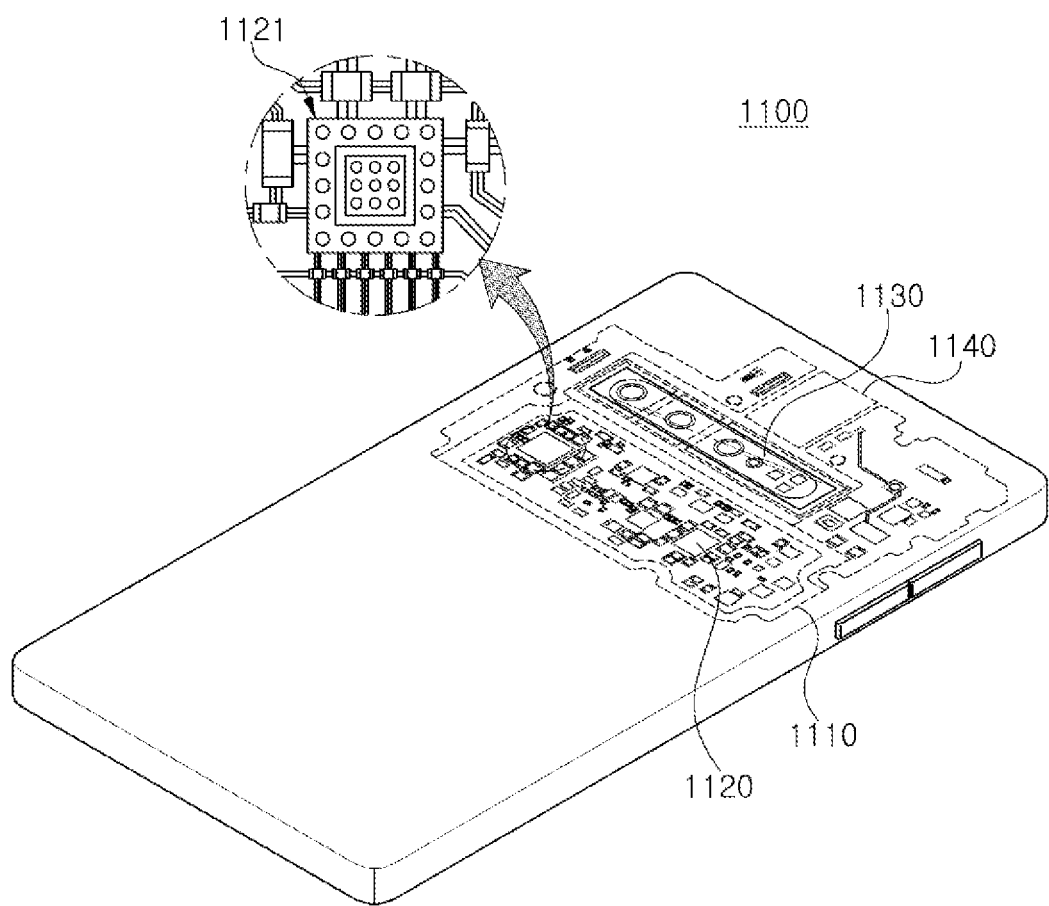
FIG. 6B is a perspective view illustrating a structure of an electronic device in which the printed circuit board according to an exemplary embodiment in the present disclosure may be disposed.
Figure 6C:
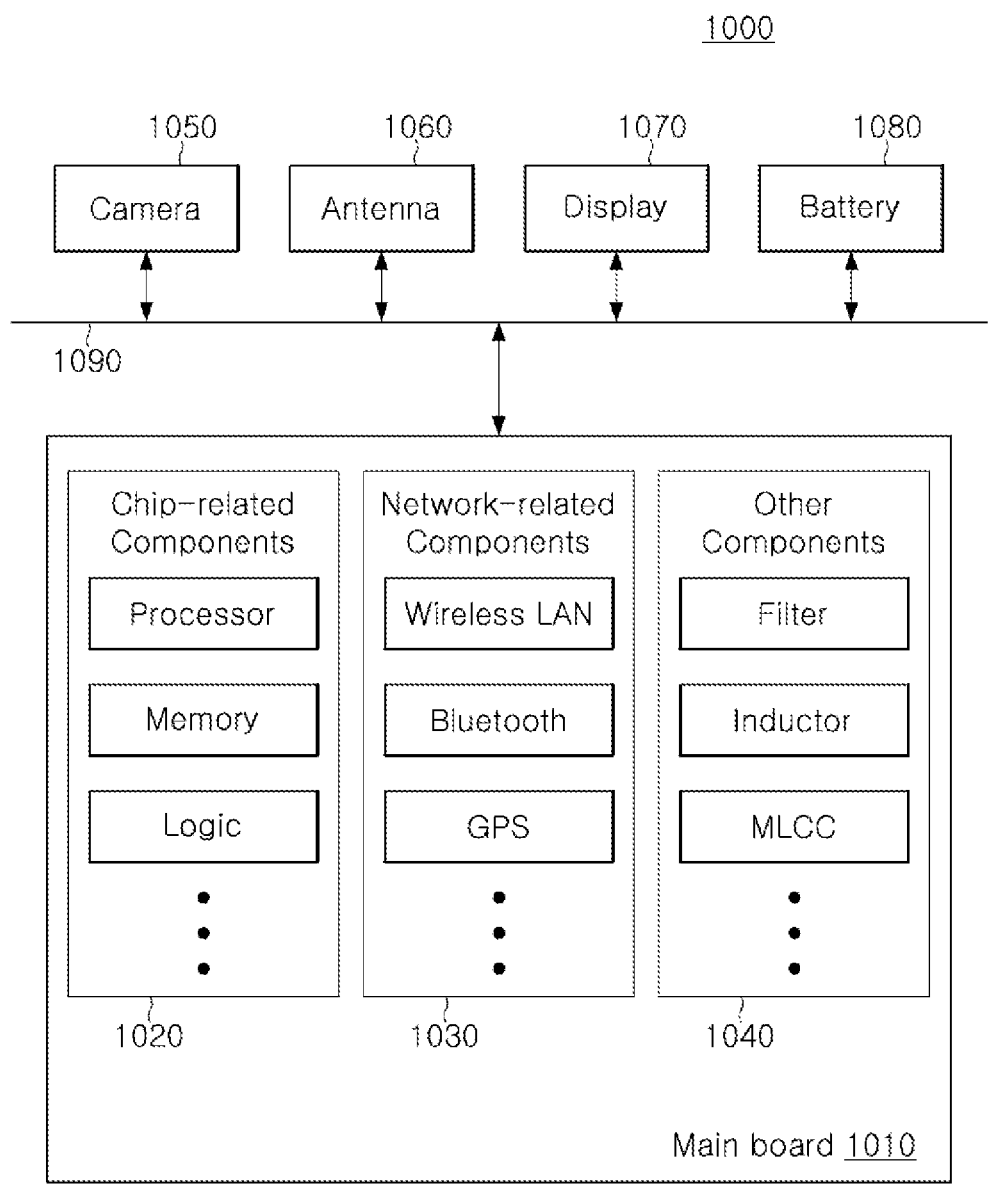
FIG. 6C is a block diagram illustrating an electronic device system in which a printed circuit board according to an exemplary embodiment in the present disclosure may be disposed.

FIG. 6B is a perspective view illustrating a structure of an electronic device in which the printed circuit board according to an exemplary embodiment in the present disclosure may be disposed, and FIG. 6C is a block diagram illustrating an electronic device system in which a printed circuit board according to an exemplary embodiment in the present disclosure may be disposed.

Referring to FIGS. 6B and 6C, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, these chip related components 1020 may be combined with each other. These chip related components 1020 may have a package form including the chips or the electronic components described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, these other components 1040 are not limited thereto, but may also include chip component types of passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other electronic components may include, for example, a camera 1050, an antenna 1060, a display 1070, a battery 1080, or the like. These other electronic components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

An electronic device may be, for example, a smartphone 1100. A motherboard 1110 may be accommodated in the smartphone 1100, and various components 1120 may be physically or electrically connected to the motherboard 1110. In addition, other components that may or may not be physically or electrically connected to the motherboard 1110, such as a camera module 1130 and/or a speaker 1140, may be accommodated in the smartphone 1100. Some of the components 1120 may be the chip related components, for example, a component package 1121, but are not limited thereto. The component package 1121 may have a form of a printed circuit board on which an electronic component including an active component and/or a passive component are surface-mounted. Alternatively, the component package 1121 may have a form of a printed circuit board in which an active component and/or a passive component are embedded. Meanwhile, the electronic device is not necessarily limited to the smartphone 1100, but may be other electronic devices as described above. The motherboard 1110 may be the printed circuit board of FIGS. 5A and 5B, but the printed circuit board is not limited to the motherboard 1110.

As set forth above, in the printed circuit board according to an exemplary embodiment in the present disclosure, miniaturization efficiency and reliability may be improved.

While exemplary embodiments have been shown and described above, it will be apparent to those skilled in the art that modifications and variations could be made without departing from the scope of the present invention as defined by the appended claims.

What is claimed is:

1. A printed circuit board comprising:
an insulating layer;
a conductive pattern disposed within the insulating layer;
a skin layer disposed on the insulating layer and having an opening on the conductive pattern; and gold (Au) contained in a connection layer disposed in the opening to connect to a portion of the conductive pattern and at least partially surrounded by the skin layer.

2. The printed circuit board of claim 1, wherein the skin layer includes Ajinomoto build-up film (ABF).

3. The printed circuit board of claim 1, wherein the skin layer does not surround the conductive pattern, and
the conductive pattern contains copper (Cu).

4. The printed circuit board of claim 1, wherein a width of the conductive pattern is greater than that of the connection layer, and
a thickness of the conductive pattern exceeds 0 µm and is 10 µm or less.

5. The printed circuit board of claim 1, wherein a thickness of the connection layer is smaller than that of the skin layer, and is greater than a half of a thickness of the conductive pattern.

6. The printed circuit board of claim 1, wherein a side surface of the skin layer in contact with the connection layer has a step form.

7. The printed circuit board of claim 1, wherein the connection layer includes an electroless plating layer.

8. The printed circuit board of claim 1, further comprising:
a solder in contact with the connection layer and having a melting point lower than that of the conductive pattern; and
a first integrated circuit (IC) connected to the connection layer through the solder.

9. The printed circuit board of claim 8, further comprising a second IC disposed on the skin layer,
wherein the first IC is connected to a portion of the connection layer, and
the second IC is connected to another portion of the connection layer.

10. The printed circuit board of claim 1, wherein an interface between the conductive pattern and the connection layer is disposed on a level of an interface of the insulating layer and the skin layer.

11. A printed circuit board comprising:
a first insulating layer;
a first conductive pattern disposed within the first insulating layer;
a first skin layer disposed on the first insulating layer and having a first opening on the first conductive pattern;
a connection layer at least partially surrounded by the first skin layer and disposed in the first opening to connect to a portion of the first conductive pattern;
a second insulating layer surrounding an area overlapping the first insulating layer in a vertical direction;
a second conductive pattern disposed within the second insulating layer; and
a second skin layer disposed on the second insulating layer and having a second opening on the second conductive pattern,
wherein an insulating material contained in the first skin layer is different from an insulating material contained in the second skin layer, and
the second skin layer is disposed around at least a portion of a side surface of the first insulating layer.

12. The printed circuit board of claim 11, wherein the first skin layer includes Ajinomoto build-up film (ABF).

13. The printed circuit board of claim 11, wherein the connection layer contains gold (Au).

14. The printed circuit board of claim 13, wherein the connection layer includes an electroless plating layer.

15. The printed circuit board of claim 11, wherein a thickness of the connection layer is smaller than that of the first skin layer, and is greater than a half of a thickness of the first conductive pattern.

16. The printed circuit board of claim 11, wherein a side surface of the first skin layer in contact with the connection layer has a step form.

17. The printed circuit board of claim 11, further comprising:
a first IC disposed on a portion of the first skin layer and a portion of the second skin layer; and
a second IC disposed on another portion of the first skin layer and another portion of the second skin layer.

18. The printed circuit board of claim 1,
wherein the connection layer has a tapered shape having a width decreasing in a direction from the connection layer to the conductive pattern.

19. The printed circuit board of claim 18, wherein a side surface of the skin layer in contact with the connection layer has a step form.

20. The printed circuit board of claim 11, comprising a substrate including the first insulating layer, the first conductive pattern, the first skin layer, and the connection layer,
wherein the substrate is disposed in a cavity that penetrates through at least a portion of the second insulating layer and the second skin layer.

* * * * *